United States Patent
Hur

[11] Patent Number: 6,033,933
[45] Date of Patent: Mar. 7, 2000

[54] METHOD FOR ATTACHING A REMOVABLE TAPE TO ENCAPSULATE A SEMICONDUCTOR PACKAGE

[75] Inventor: Ki-Rok Hur, Cheongju, Rep. of Korea

[73] Assignee: LG Semicon Co., Ltd, Choongcheongbuk-Do, Rep. of Korea

[21] Appl. No.: 08/896,021

[22] Filed: Jul. 17, 1997

[30] Foreign Application Priority Data

Feb. 14, 1997 [KR] Rep. of Korea .......... 97/4406

[51] Int. Cl.⁷ .................... H01L 21/56
[52] U.S. Cl. ............ 438/112; 438/110; 438/111; 438/124; 438/126; 438/127
[58] Field of Search ................. 438/112, 126, 438/127, 367, 371, 124, 110, 111, 106; 257/787, 676

[56] References Cited

U.S. PATENT DOCUMENTS

| | | | |
|---|---|---|---|
| 5,134,773 | 8/1992 | LeMaire et al. | 29/827 |
| 5,273,938 | 12/1993 | Lin et al. | 438/107 |
| 5,366,933 | 11/1994 | Golwalkar et al. | 438/107 |
| 5,450,283 | 9/1995 | Lin et al. | 361/704 |
| 5,474,958 | 12/1995 | Djennas et al. | 438/118 |

FOREIGN PATENT DOCUMENTS

| | | |
|---|---|---|
| 317909 | 2/1989 | European Pat. Off. . |
| 62-090213 | 4/1987 | Japan . |
| 63-283136 | 11/1988 | Japan . |
| 3-94431 | 4/1991 | Japan . |

*Primary Examiner*—Olik Chaudhuri
*Assistant Examiner*—Alonzo Chambliss
*Attorney, Agent, or Firm*—Morgan, Lewis & Bockius LLP

[57] ABSTRACT

A method for fabricating a semiconductor package having a semiconductor chip and leads attached to the chip includes the steps of placing a tape over the leads attached to the semiconductor chip, forming a mold to encapsulate the semiconductor chip and the leads while exposing a portion of the leads contacting the tape, and removing the tape over the leads after the mold forming step.

12 Claims, 3 Drawing Sheets

METHOD FOR ATTACHING A REMOVABLE TAPE TO ENCAPSULATE A SEMICONDUCTOR PACKAGE

BACKGROUND OF THE INVENTION

1. Field of the Invention

The present invention relates to a semiconductor package, and more particularly, to an improved method of fabricating a semiconductor package.

2. Description of the Related Art

FIG. 1 shows a cross-sectional view of a conventional semiconductor package in which a deflash process is not carried out. Referring to FIG. 1, on each side portion of a semiconductor chip 1 there is attached an insulating adhesive 2. On each of the adhesive 2, inner leads 3a are provided. An outer lead 3b is upwardly extended from each corresponding inner lead 3a. Bonding pads (not shown) formed on the chip 1 are electrically connected to the inner leads 3a by conductive wires 4. A certain area of the package including the conductive wires 4 is molded by a molding compound 5 to expose an upper surface of each of the outer leads 3b externally. That is, the conventional semiconductor package includes a package body 6 that exposes the upper surface of the outer leads 3b and a flash portion 7 formed on a portion of the upper surface of the outer lead 3b. The flash portion 7 on the upper surface of the outer leads 3b is formed in accordance with the molding compound 5.

With reference to FIGS. 2A through 2C, the fabrication method of the conventional semiconductor package will now be described.

As shown in FIG. 2A, the outer leads 3b extended from the inner leads 3a, which are attached to the chip 1 by means of the adhesive 2, are placed in and over a molding recess 10 provided in a lower casting mold 8. An upper casting mold 9 is covered thereon. Here, chip pads (not shown) on the chip 1 are connected to the inner leads 3a of a lead frame 3 by the conductive wires 4.

Then, as shown in FIG. 2B, the casting molds 8, 9 are clamped to each other under pressure so as to be closely contacting each other with the outer leads 3b therebetween. Molten molding compound 5 is injected into the respective molding recesses 10 and hardened for a certain time to thereby form a package body 6 per each molding recess 10.

Referring to FIG. 2C, the casting molds 8, 9 are detached from the respective package bodies 6, thereby completing the conventional semiconductor package fabrication. At this time, on the upper surface of the exposed outer leads 3b, there is generated a flash 7 resulting from the molding compound 5.

However, the conventional semiconductor package has disadvantages in that due to a bending of the outer leads 3b during the clamping of the casting molds 8, 9, it has been difficult to prevent the molding compound 5 from permeating between the upper casting mold 9 and the outer leads 3b. Moreover, a mechanical or chemical deflashing process must be applied to eliminate the flash 7 formed on the upper surface of the outer leads 3b which are externally exposed, in order to carry out a solder mounting after the compound molding.

SUMMARY OF THE INVENTION

Accordingly, the present invention is directed to a semiconductor package fabrication method that substantially obviates one or more of the problems due to limitations and disadvantages of the related art.

It is an object of the present invention to provide a semiconductor package fabrication method that does not require a deflash step.

It is another object of the present invention to provide a semiconductor package fabrication method that allows better solderability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor package fabrication method includes the steps of aligning a plurality of inner leads attached on a semiconductor chip and a plurality of outer leads extended bendingly and upwardly from the corresponding inner leads respectively in and over a molding recess formed in a lower casting mold, aligning a tape and an upper casting mold sequentially on the lower casting mold receiving the inner and outer leads including the chip, clamping the lower and upper casting molds to each other so that an upper surface of the respective outer leads can be attached to the tape, injecting into a corresponding molding recess and hardening a molten molding compound for thereby forming a semiconductor package body, and removing the casting molds and the tape from the package body.

In another aspect of the present invention, a method for fabricating a semiconductor package having a semiconductor chip and leads attached to the chip, comprises the steps of placing a tape over the leads attached to the semiconductor chip; forming a mold to encapsulate the semiconductor chip and the leads while exposing a portion of the leads contacting the tape; and removing the tape over the leads after the mold forming step.

In a further aspect of the present invention, a method for fabricating a semiconductor package, includes the steps of placing a plurality of inner leads attached on a semiconductor chip and a plurality of outer leads extended from the corresponding inner leads in a molding cavity formed in a first casting mold; aligning a tape and a second casting mold over the first casting mold; placing the second casting mold over the first casting mold attaching the tape onto the outer leads; injecting into a corresponding mold cavity a molding material to form a semiconductor package body; and removing the casting molds; and removing the tape from the outer leads.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

With reference to the accompanying drawings, the semiconductor package fabrication method according to the present invention will now be described.

Figure 1:
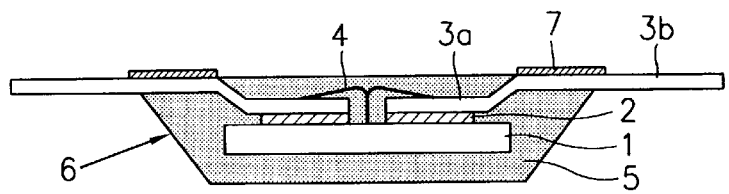
FIG. 1 is a schematic cross-sectional view of a conventional semiconductor package.
Figure 2A:
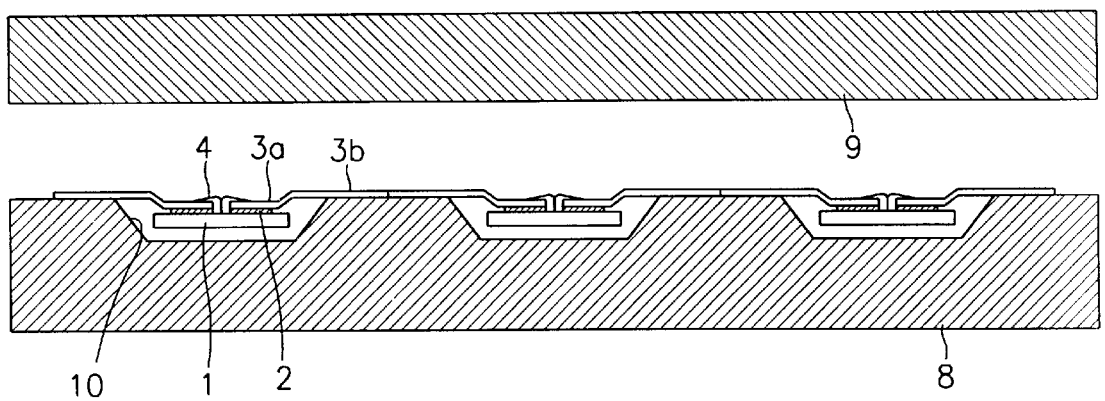
FIGS. 2A through 2C sequentially illustrate a conventional semiconductor package fabrication method.
Figure 2B:
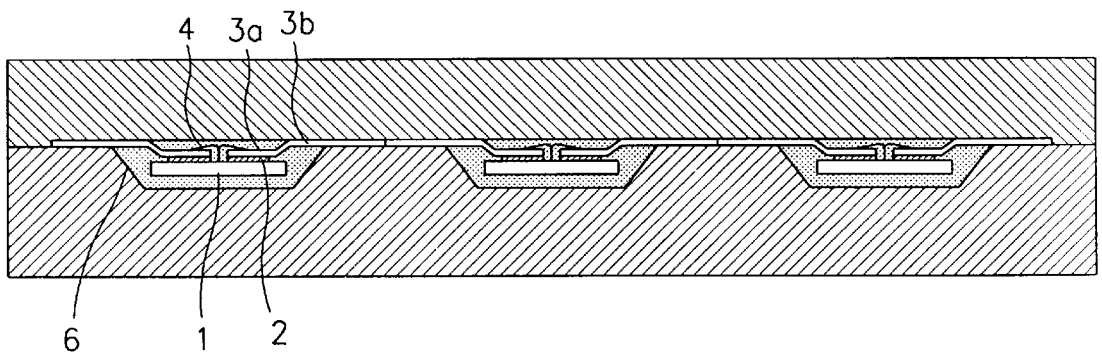
Figure 2C:
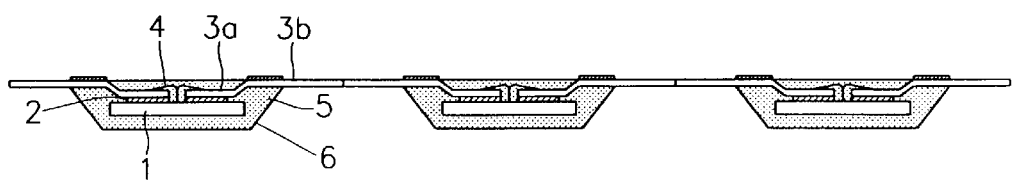
Figure 3:
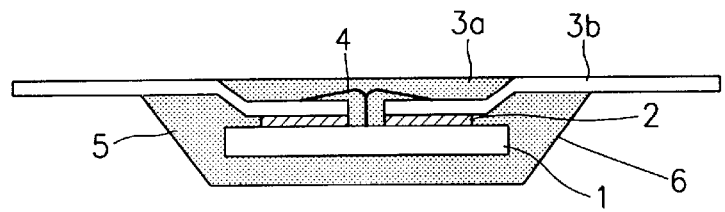
FIG. 3 is a schematic cross-sectional view of a semiconductor package according to the present invention.

Referring to FIG. 3, the semiconductor package fabricated in accordance with the present invention prevents any flash from occurring on the upper surface of outer leads. The semiconductor package fabrication method according to the present invention will now be sequentially explained with reference to FIGS. 4A–4D.

Figure 4A:
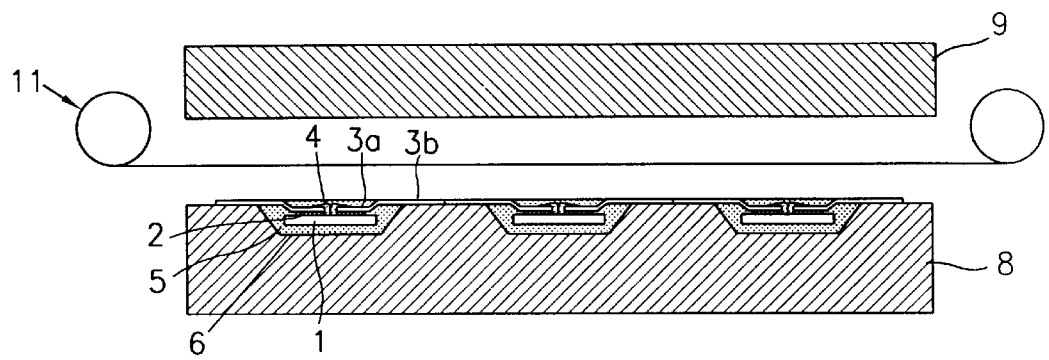
FIGS. 4A through 4D sequentially illustrate a semiconductor package fabrication method according to the present invention.

As shown in FIG. 4A, inner leads 3a and outer leads 3b bendingly and upwardly extended from the corresponding inner leads 3a are straddled in and over a mold cavity 10 formed in a lower casting mold 8. Over the leads 3a and 3b, there are provided a reel-to-reel type tape 11 and a upper casting mold 9 which are ready for placement. The reel-to-reel type tape 11 is preferably heat-resistant and is employed to prevent flash from occurring on the upper surface of the outer leads 3b. The tape is positioned between the upper and lower casting molds 8 and 9 and supplied for each molding cycle.

Figure 4B:
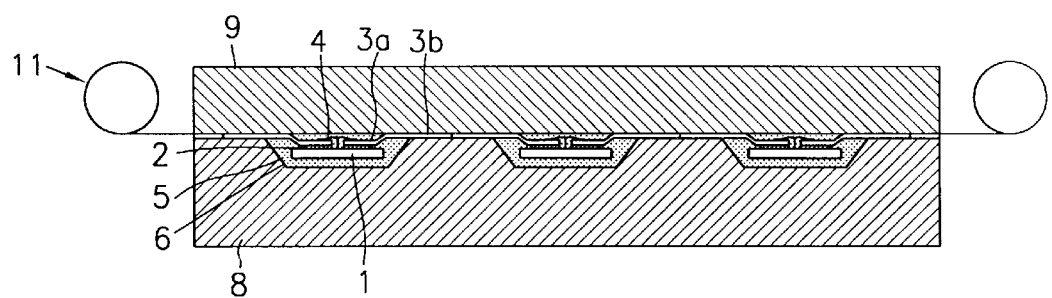

Next, as shown in FIG. 4B, the casting molds 8 and 9 are clamped to each other so that the tape can be attached on the upper surface of the respective outer leads 3b under a certain pressure, the molten molding compound 5 is injected into the mold cavity 10 and hardened for a certain time period so as to form one package body 6 per mold cavity 10. At this time, the adhesion between the outer leads 3b and the tape 11 depends on whether there is an adhesive layer 11a (see FIG. 5).

Figure 4C:
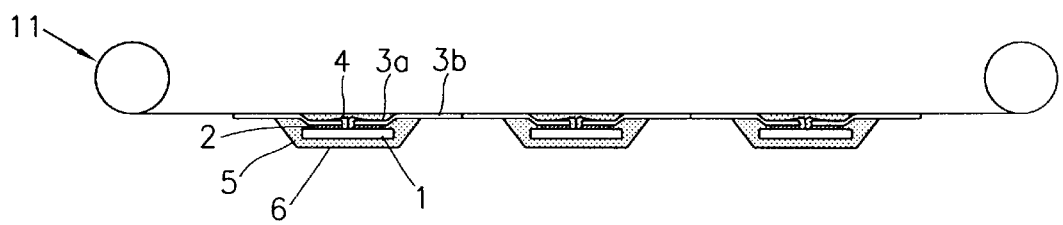
Figure 4D:
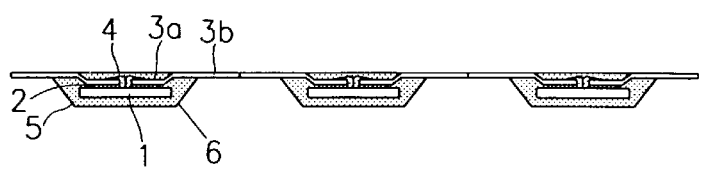

Referring to FIG. 4C, the tape 11 is removed from the package body 6, whereby the semiconductor package according to the present invention which does not have a flash portion and thus does not require removal of any flash from the upper surface of the outer leads 3b is completed. The tape 11 is removed from the surface where a flash would occur for conventional methods, by scanning thereonto infrared rays to facilitate the removal. Also, the tape may be treated with ultra-violet light before removing the tape from the leads to facilitate the removal. The tape is preferably an infrared-hardened tape or an adhesive-spread tape. Also, a tape without an adhesive property can be employed, if desired, which can decrease production cost.

Figure 5:
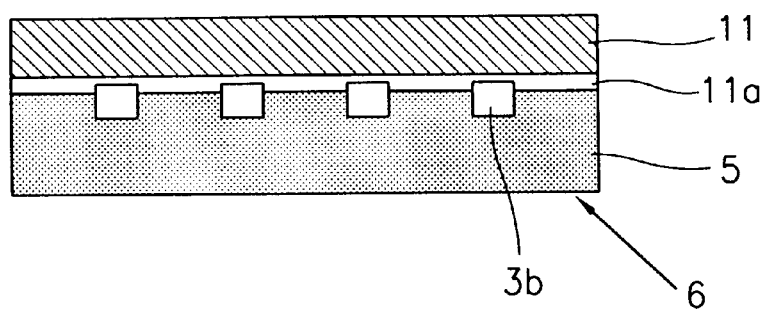
FIG. 5 is a schematic cross-sectional view showing embedded outer leads which are exposed to an adhesive layer of a tape during a molding process.
Figure 6:
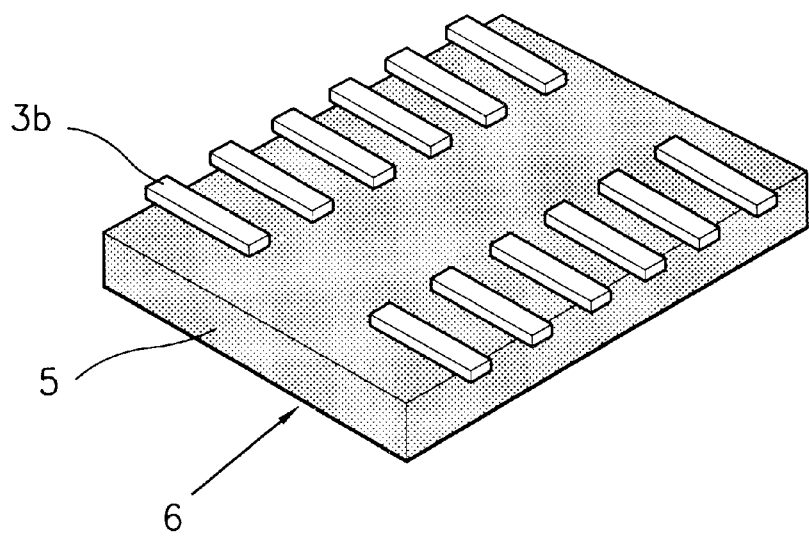
FIG. 6 is a perspective view of a semiconductor package after molding and tape removal, according to the present invention.

As shown in FIG. 5, the upper surface of the outer leads 3b are embedded to a certain extent into the adhesive layer 11a of the tape 11 during the molding process. Embedding a portion of the outer leads 3b in the adhesive layer 11a, for example, forms a protrusion extending outward from the package, as shown in FIG. 6. In particular, the upper surfaces of the outer leads 3b which are embedded into the adhesive layer 11a of the tape 11 are exposed externally by removing the tape 11. This protrusion has an added advantage of allowing better solderability when the leads are soldered to a printed circuit board, for example.

As described above, the semiconductor package according to the present invention prevents a flash from occurring on the upper surface of the outer leads 3b after molding and enhances a solder joint reliability during a solder mounting. Further, the present invention simplifies the package fabricating process and decreases production cost by not requiring a deflashing process.

Although the present invention has been discussed with reference to a tape and a tape having an adhesive, any suitable material may be used to prevent flash and to enhance solder joint reliability.

It will be apparent to those skilled in the art that various modifications and variations can be made in the semiconductor package fabrication method of the present invention without departing from the spirit or scope of the invention. Thus, it is intended that the present invention cover the modifications and variations of the invention provided they come within the scope of the appended claims and their equivalents.

What is claimed is:

1. A method for fabricating a semiconductor package having a semiconductor chip and leads attached to the chip, the method comprising the steps of:

placing a heat resistant infrared-hardened tape over the leads attached to the semiconductor chip for facilitating removal of the tape;

forming a mold to encapsulate the semiconductor chip and the leads while exposing a portion of the leads contacting the tape; and removing the tape over the leads after the mold forming step.

2. The method according to claim 1, wherein in the tape placing step, the tape is placed on the leads with an adhesive portion of the tape contacting the leads.

3. The method according to claim 1, wherein in the tape placing step, the adhesive portion is placed on the tape where a portion of the leads are embedded within the adhesive.

4. The method according to claim 1, further comprising the step of treating the tape with ultra-violet light before removing the tape from the leads.

5. The method according to claim 1, further comprising the step of scanning an infrared light on the tape before removing the tape from the leads.

6. A method for fabricating a semiconductor package having a semiconductor and leads attached to the chip, the method comprising the steps of:

placing a reel-to-reel tape on leads of a plurality of lead frames simultaneously;

forming a mold to encapsulate the semiconductor chip and the leads while exposing a portion of the leads contacting the tape; and removing the tape over the leads after the mold forming step.

7. A method for fabricating a semiconductor package, the method comprising the steps of:

placing a plurality of inner leads attached on a semiconductor chip and a plurality of outer leads extended from the corresponding inner leads in a molding cavity formed in a first casting mold;

aligning a heat, resistant infrared-hardened tape over the first casting mold for facilitating removal of the tape;

placing a second casting mold over the first casting mold attaching the tape onto the outer leads;

injecting into a corresponding mold cavity a molding material to form a semiconductor package body; and removing the tape from the outer leads.

8. The method according to claim 7, wherein in the tape placing step, the tape is placed on the leads with an adhesive portion of the tape contacting the leads.

9. The method according to claim 7, wherein in the tape placing step, the adhesive portion is placed on the tape where a portion of the leads are embedded within the adhesive.

10. The method according to claim 7, further comprising the step of treating the tape with ultra-violet light before removing the tape from the leads.

11. The method according to claim 7, further comprising the step of scanning an infrared light on the tape before removing the tape from the leads.

12. A method for fabricating a semiconductor package, the method comprising the steps of:

placing a plurality of inner leads attached on a semiconductor chip and a plurality of outer leads extended from the corresponding inner leads in a molding cavity formed in a first casting mold;

placing a reel-to-reel tape on leads of a plurality of lead frames simultaneously;

placing a second casting mold over the first casting mold attaching the tape onto the outer leads;

injecting into a corresponding mold cavity a molding material to form a semiconductor package body; and removing the tape from the outer leads.

* * * * *